(12) United States Patent
Viola et al.

(10) Patent No.: US 7,993,416 B2
(45) Date of Patent: Aug. 9, 2011

(54) PRE-FILLED CRYSTALLIZATION PLATES AND METHODS FOR MAKING AND USING SAME

(75) Inventors: Jean-Pascal Viola, Ville d'Anjou (CA); Christian Houde, Montreal (CA); Marie-Claude Marchand, Montreal (CA); David Bouchard, Verdun (CA)

(73) Assignee: Qiagen Canada Inc., Montreal, Quebec (CA)

( * ) Notice: Subject to any disclaimer, the term of this patent is extended or adjusted under 35 U.S.C. 154(b) by 340 days.

(21) Appl. No.: 12/392,381

(22) Filed: Feb. 25, 2009

(65) Prior Publication Data

US 2009/0155145 A1 Jun. 18, 2009

Related U.S. Application Data

(62) Division of application No. 10/758,325, filed on Jan. 16, 2004, now Pat. No. 7,514,043.

(60) Provisional application No. 60/440,635, filed on Jan. 17, 2003, provisional application No. 60/485,400, filed on Jul. 9, 2003, provisional application No. 60/466,074, filed on Apr. 29, 2003.

(51) Int. Cl.
*B01D 9/00* (2006.01)
(52) U.S. Cl. .............................. 23/300; 23/295 R; 23/296
(58) Field of Classification Search ................ 23/295 R, 23/296, 300
See application file for complete search history.

(56) References Cited

U.S. PATENT DOCUMENTS 7,514,043 B2 * 4/2009 Viola et al. .................... 422/534
* cited by examiner

*Primary Examiner* — Edward M Johnson
(74) *Attorney, Agent, or Firm* — Norton Rose OR LLP

(57) ABSTRACT

The present invention generally relates to encapsulation of crystallization solutions in pierceable reservoirs in order to prevent evaporation of the crystallization solutions, thereby allowing safe transport/shipping, from a workstation to another workstation, and safe storage of pre-filled microplates used to carry large number of vapor-diffusion crystallization experiments.

8 Claims, 6 Drawing Sheets

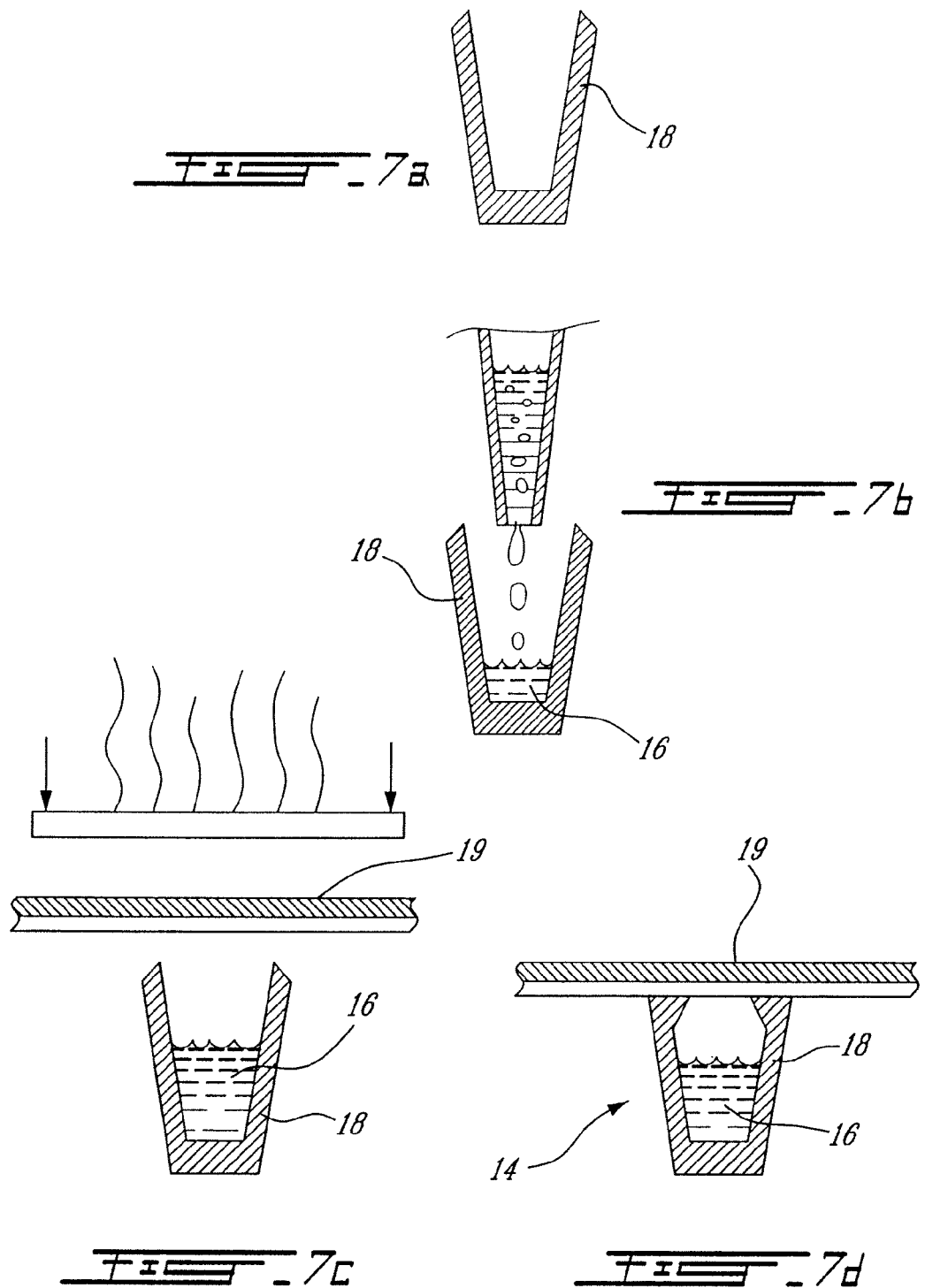

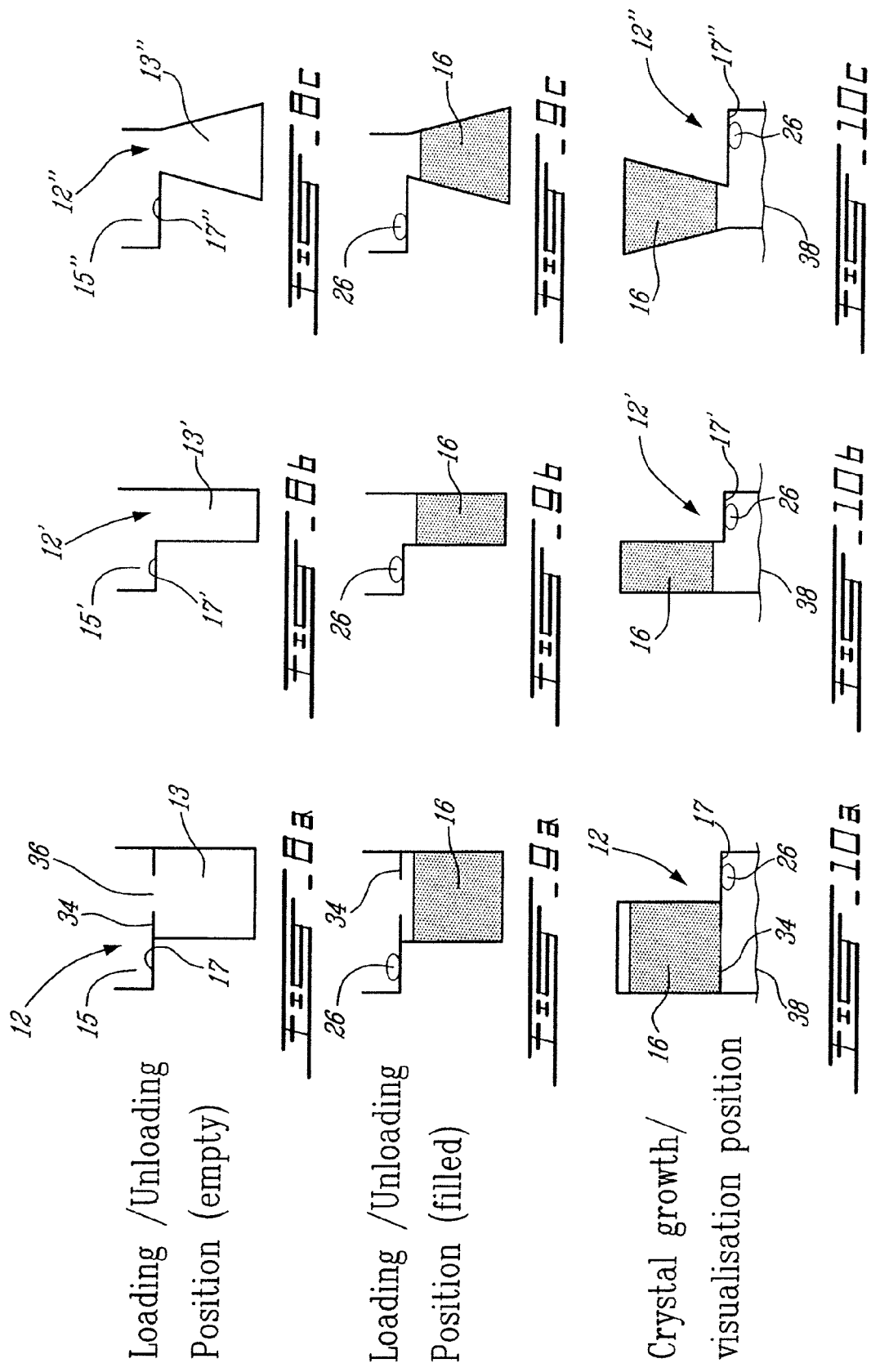

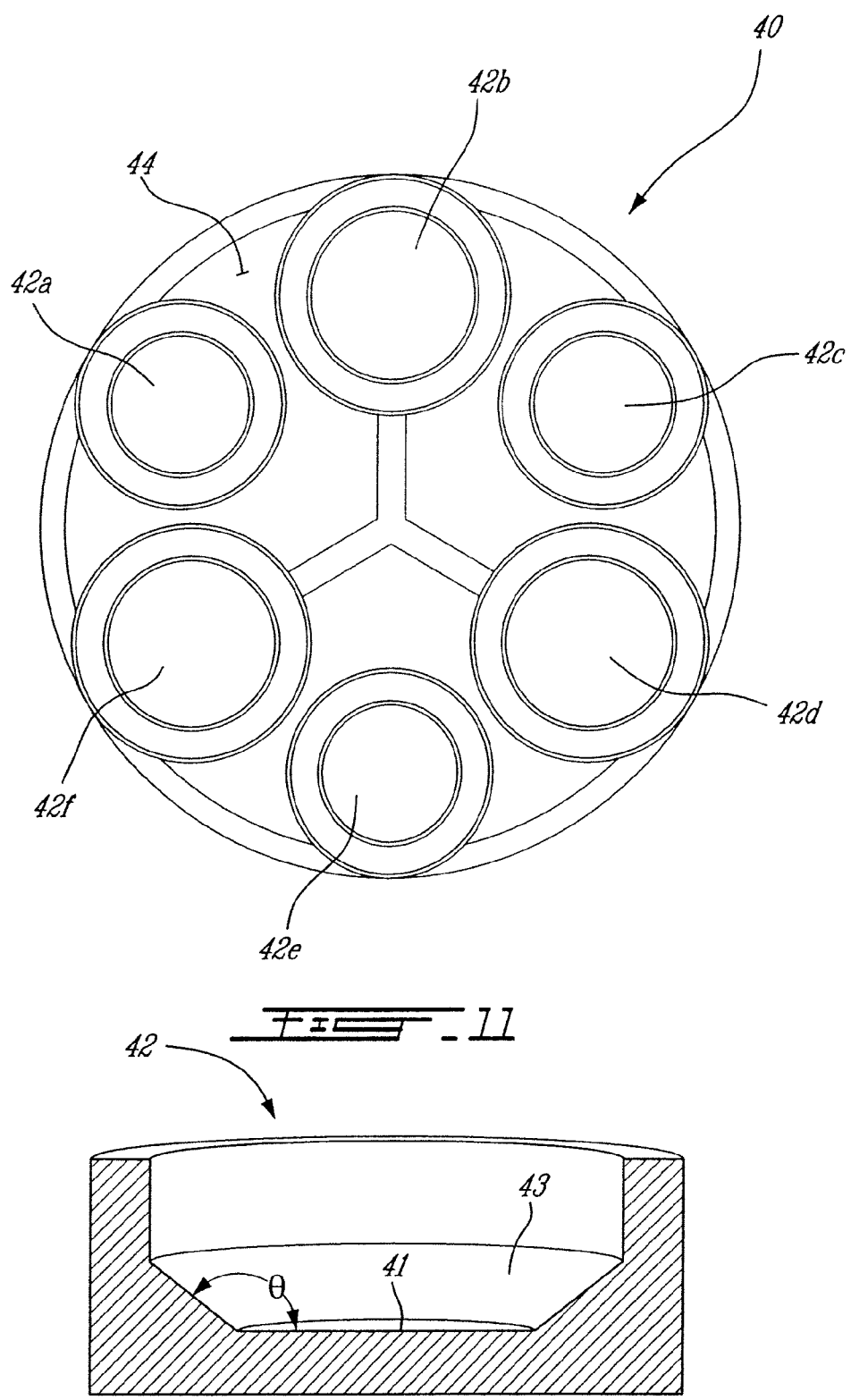

PRE-FILLED CRYSTALLIZATION PLATES AND METHODS FOR MAKING AND USING SAME

RELATED APPLICATIONS

This application is a Divisional of U.S. patent application Ser. No. 10/758,325 filed Jan. 16, 2004 now U.S. Pat. No. 7,514,043 which claims priority on the following U.S. Provisional Patent Applications: No. 60/440,635 filed Jan. 17, 2003; No. 60/466,074 filed Apr. 29, 2003 and No. 60/485,400 filed Jul. 9, 2003.

BACKGROUND OF THE INVENTION

1. Field of the Invention

The present invention relates to crystallography and, more particularly, to the pre-filling of microplates with a precipitating solution for transport and handling prior to utilization.

2. Description of the Prior Art

Crystallography is an extremely useful tool for scientists, and is therefore a field of research attracting a lot of interest. It is a powerful means that provides precise and detailed description of the three-dimensional structure of the molecules, and is of great help in the understanding of their functions. Crystallography of macromolecules like proteins is extensively used today, academically as well as industrially.

Although three-dimensional structures of simple proteins have been obtained through crystallographic methods that necessitate crystal formation, it is not always easy to obtain crystals from macromolecules. For example, the preferred conditions for the crystallization of a given molecule can take several hundreds if not thousands of trials. As a result, means and methods have been developed to perform a great number of trials relatively quickly, including hanging-drop and sitting-drop methods. All such methods use the benefit of vapor diffusion to obtain the crystals.

According to the vapor diffusion technique, a small volume of a macromolecule sample is mixed with an approximately equal volume of crystallization or precipitating solution. The resulting drop of liquid is sealed in a chamber with a much larger reservoir volume of crystallization solution. The drop is kept separate from the reservoir of crystallization solution either by hanging the drop from a crystallization surface or by sitting the drop on a pedestal above the level of the crystallization solution in the reservoir. Over time, the crystallization drop and the crystallization solution equilibrate via vapor diffusion of volatile chemical species. Equilibration by vapor diffusion occurs between the drop and the reservoir until supersaturation of the macromolecule is achieved, resulting in crystallization of the macromolecule sample in the drop.

The process of growing biological macromolecule crystals remains, however, a highly empirical process during which different crystallization parameters are varied using a trial and error approach. Usually those parameters are: pH, temperature, and salt concentration in the crystallization drop, the concentration of the macromolecule to be crystallized and the concentration of the precipitation agents (of which there are hundreds). Using a trial and error approach, one would like to try as many crystallization conditions (screening of crystallization conditions), by varying parameters described above, to have a better probability to obtain the crystallization condition that will allow the growth of well diffracting macromolecule crystals. To allow laboratory to work faster by not having to prepare all the different solutions necessary to perform many different trials, company like Hampton Research have introduced pre-formulated screens usually composed of multiples of 24 tubes of 10 mL of different crystallization solutions. Following the venue of Hampton Research on the market other company like MDL, Emerald Biostructures and Jena Biosciences started introducing pre-formulated crystallization screens. One problem with all those crystallization solutions is that they need to be transferred into the crystallization plates either manually or automatically when performing crystallization trials. This represents a long and arduous work that has to be performed by qualified and skilled technical personnel.

Furthermore, the transfer of the crystallization solutions into the microplates generally needs to be done rapidly in order to avoid evaporation of the crystallization liquid. Such evaporation would alter the composition of the solution, thereby creating problem to reproduce the same condition if crystal growth occur. Typically, transfer is done using a micropipette. The technicians have to open a tube containing the solution and then pipette the solution into the crystallization reservoir. To make transfer faster in SBS standard crystallization plates, one can use multi-channel micro-pipette with SBS standard deep well block which are pre-filled with up to 2 mL times 96 different crystallization conditions (to set-up 96 wells crystallization plates). To do so, researchers need to centrifuge the block (to prevent cross-contamination of the wells when removing the seal), unseal the block and start to transfer the solutions. One problem is that evaporation start to occur as soon as the block is unsealed; it is an important issue since the whole procedure can take several minutes. Another problem is that the block needs to be resealed if researcher do not used all the solutions. To use all the solution, researchers need to pre-fill a minimum of 10 plates even if they typically need up to 3 plates (1 per temperature). It is also important to mention that errors with labeling and dispensing, when handling hundreds of different solutions, and cross-contamination can occur.

Another approach is to use sophisticated automated liquid handling stations developed by companies like Tecan, Gilson or Robodesign. Those stations are useful when performing routine molecular biology experiments involving DNA manipulation since the number of solutions to handle is reduced and also evaporation is less an issue (proteins are far more unstable over time and temperature than DNA). For example, U.S. Pat. No. 6,148,878 issued on Nov. 21, 2002 to Ganz et al. discloses an automated machine for filling a plurality of microplates. One problem with this system is that it is not suitable for pre-filling multiple microplates to do crystallization trials since there is no provision of any means that could be used for automatically and efficiently sealing the wells of the microplates for storage purposes before utilization thereof.

In summary, filling of the wells of a microplate with a crystallization solution is an arduous task which if not well executed under strict pre-established criteria might produce an undesirable wide variation in experimental results while jeopardizing the repeatability of the trials.

Therefore, efforts have been made to find ways for pre-filling the plates. One known approach involves sealing the top of a crystallization microplate with tape or a heat sealed foil. Following storage and transportation, the seal needs to be removed prior to setup crystallization experiments to provide access to the top surface of the plate where grease is typically applied about each well. When removing the seal, there is a risk to take away liquid that might be present on the seal due to transportation of the plate or condensation when temperature change occurs, thus creating unwanted experimental variations by changing the volume or the concentration of the solution left in the reservoir. To remove the liquid on the sealing mean, researchers need to centrifuge the plate prior to use; this can be complicated to automate and also requires extra equipments and an extra step. Furthermore, the sealing of the top of the microplate and the centrifugation solution is only applicable to hanging-drop crystallization plates. Indeed, in the case of a sitting-drop plate where the crystallization surface is located within the well below the top surface of the plate and the top sealing means, the crystallization solution contained in the well is free to contact the crystallization surface, thereby contaminating the same. Furthermore, in this case, centrifugation cannot be used to remove liquid from the undersurface of the top sealing means since such centrifugation will cause portion of the crystallization solution to contact the crystallization surface which is even more problematic.

According to applicants' knowledge, no one has heretofore been able to pre-fill, prior to transport/manipulation, plates or microplates used to carry sitting-drop crystallization experiments. This is due to the fact that the crystallization surface (where the drop containing the macromolecule to be crystallized sits) will most likely be spoiled/contaminated by the precipitating solution during manipulation/transport between the places were the microplates are filled and where the crystallization drop set-up is done.

Researchers are always trying to use smaller drops when carrying vapor diffusion crystallization experiments in order to minimize the amount of protein used during crystallization. When using small drops of less than 1 mL some problems may occur because equilibration can be to fast to allow good crystallization conditions to be reached. There is thus a need to find some means to slow down or control the equilibration process when conducting vapor diffusion experiments with very small volume of solution. Various approaches have been tested to control/modify/change the time required for full equilibration between the drop and the mother-liquid (the crystallization solution). Some have tried to use oil to slow down/control the evaporation process (D'Arcy et al. (1996) J. Crystal Growth 168, 175-180). One drawback of this approach resides in the fact that an extra step needs to be done to dispense oil in the reservoir over the crystallization solution. Moreover, when preparing a hanging-drop crystallization set-up, the oil can possibly reduce the quality of the image observed under the microscope. Finally, in some cases, the wells of the microplates can be too small to add enough oil.

In summary the process of growing biological macromolecule crystals remains a highly empirical process. Testing numerous conditions of variables that affect crystal growth, by means of thousands of crystallization trials, eventually leads to the optimal crystallization condition. Consequently the market is in need of inventions to help to rapidly and easily generate many reproducible crystallization trials. Therefore, there is a need for a device that will ease the setup of multiple crystallization trials while minimizing the risk of errors and cross-contamination during such setup. Another important need is to have a device/method that would increase experimental reproducibility due to evaporation or liquid losses between the filling of the microplates with the crystallization solutions and the setup of the crystallization drops. Finally, there is a need for a device that would also allow researchers to control the rate of vapor-diffusion equilibrium of multiple crystallization trials in multiple microplates.

SUMMARY OF THE INVENTION

It is therefore an aim of the present invention to provide a crystallization plate pre-filled with a crystallization solution.

It is also an aim of the present invention to prevent contamination of a crystallization surface with a crystallization reactant during transport or handling of a pre-filled sitting-drop crystallization plate.

It is a further aim of the present invention to provide a means for controlling the rate of the vapor diffusion in a sitting-drop or hanging-drop crystallization experiment.

It is still a further aim of the present invention to simplify the operations that must be executed to carry crystallization experiments by vapor diffusion techniques.

It is still a further aim of the present invention to provide a method for pre-filling a microplate with a crystallization solution.

It is still a further aim of the present invention to provide a new method for conducting a crystallization experiment.

It is still a further aim of the present invention to provide a new crystallization plate that provides for the preparation of experiments just as a standard sitting drop set-up and inversion of the plate to obtain hanging drop experiments.

It is a still further aim of the present invention to provide a new hanging-drop crystallization plate having integral hanging-drop supports.

Therefore, in accordance with the present invention, there is provided a kit for use in conducting crystallization experiments, comprising a pre-filled crystallization plate having a plurality of wells, each well of said plurality of wells being open at an upper end thereof for receiving a crystallization solution, a first level of seal including individual seals recessed within each well at a distance below the upper end thereof for temporarily hermetically sealing the crystallization solution in the wells to allow safe transportation and handling of the pre-filled crystallization plate prior to utilization, and a second level of seal including a sealing surface on said plate above said first level of seal for allowing sealing of said wells above said first level of seal in order to allow vapor diffusion to occur after the individual seals have been broken.

According to another general aspect of the present invention there is provided a kit for use in conducting crystallization experiments, the kit comprising at least one crystallization solution encapsulated in a plurality of individual capsules, and at least one crystallization plate including a plurality of wells adapted to be loaded with said capsules.

In accordance with a further general aspect of the present invention, there is provided a kit for use in growing crystals by vapor diffusion, comprising a crystallization plate defining a plurality of wells pre-filled with a crystallization solution, at least one seal for separately and individually sealing said wells with said crystallization solution contained therein, wherein said seal is made of a pierceable material for allowing a hole to be defined in the seal in order to permit vapor diffusion to occur.

In accordance with a still further general aspect of the present invention, there is provided a method of making a pre-filled crystallization plate, comprising the steps of: providing a crystallization solution and a crystallization plate having a plurality of wells, and encapsulating the crystallization solution in a plurality of capsules received in said wells.

In accordance with a still further general aspect of the present invention, there is provided a method for carrying crystallization experiments, comprising the steps of: providing a crystallization plate having a plurality of wells pre-filled with a crystallization solution, the crystallization solution being individually sealed in the wells by at least one pierceable seal, piercing a hole in the seal in alignment with a selected well and pipetting a portion of the crystallization solution contained in the unsealed selected well, and for said unsealed selected well: mixing, on a drop support, the crystallization solution that has been pipetted with a macromolecule solution to obtain a drop of solution, and sealing said drop of solution in the well with said drop of solution separated from said crystallization solution contained in the well, the hole in the seal allowing vapor diffusion to occur between the drop of solution and the crystallization solution.

In accordance with another further general aspect of the present invention, there is provided a method of making a pre-filled crystallization plate, comprising the steps of: providing a crystallization plate having a plurality of wells, dispensing a crystallization solution in the wells, and individually sealing the crystallization solution in the wells by heat sealing a pierceable sheet material over the crystallization solution in the wells.

The encapsulation of the crystallization solutions in a pierceable reservoir prevents evaporation of the crystallization solutions, thereby allowing safe transport/shipping, from a workstation to another workstation, and safe storage of pre-filled microplates used to carry large number of vapor-diffusion crystallization experiments. Since a pipette tip can perform piercing of the reservoir, the present device and method is particularly advantageous in that it reduces the number of steps required to setup crystallization trials in research laboratories. Another advantage of the present device/method is that it provides for easy control of the vapor-diffusion rate of the crystallization experiments.

One embodiment of the present invention provides encapsulated crystallization solutions useful for crystallizing proteins and other molecules, especially macromolecules. According to a preferred embodiment, each capsule of crystallization solution comprises a reservoir, preferably made of plastic, small enough to be inserted into a crystallization solution containing well of a microplate, a pierceable seal that can be bonded to the reservoir to assure proper sealing, for storage, of such reservoir and a crystallization solution to be inserted into the reservoir before sealing is carried out. The pierceable material need to be made of a material that will keep an open hole once pierced to allow vapor-diffusion experiments to be carried with such a capsule.

According to a further general feature of the present invention, there is provided a new reservoir that can be sealed using a pierceable sheet, ideally using heat sealing, to allow safe transportation of the pre-filled crystallization reservoir. The reservoir can be molded, filled, sealed (by a pierceable sheet) and inserted into the crystallization cavity. The reservoir can be molded directly into a crystallization well, filled and then sealed (by a pierceable sheet). The present invention allows to safely transporting pre-filled crystallization plates or microplates without risk of contaminating the crystallization surface prior to the set-up of the crystallization experiment. The present invention provides for the control of the rate at which vapor diffusion process will occur by varying the size of the hole that will be pierced in the seal when starting the crystallization experiment.

According to another aspect of the present invention, there is provided a method of making such encapsulated crystallization solutions to be used in microplates suitable for sitting-drop or hanging-drop crystallization trials. The capsules are molded, filled with appropriated crystallization solutions, sealed with a film or foil and then inserted into the wells of a sitting-drop or a hanging-drop crystallization plate.

According to a further aspect of the present invention, there is provided a kit comprising a plurality of encapsulated crystallization solutions and at least one crystallization microplate that preferably includes a plurality of wells, the encapsulated crystallization solution being received in said wells.

The present invention is also interesting in that it allows loading of a crystallization drop setting robot with a plurality of crystallization solutions without having to open and close or transfer the crystallization solution from another container prior to the preparation of the drop setting.

In accordance with a further general aspect of the present invention, there is provided a crystallization microplate plate comprising a plurality of wells, each well including a precipitating solution reservoir for receiving a precipitating solution and a drop chamber having a crystallization surface for receiving a droplet of solution containing a macromolecule to be crystallized, said drop chamber being in communication with said precipitating solution reservoir for allowing vapor diffusion to occur between the droplet of solution and the precipitating solution after the well has been sealed, and a flow restrictor provided in said precipitating solution reservoir for retaining the precipitating solution in the precipitating solution reservoir when the crystallization microplate is inverted upside down for carrying out hanging-drop crystallization experiments.

In accordance with a still further general aspect of the present invention, there is provided a method for carrying hanging drop crystallization experiments, comprising the steps of: providing a crystallization microplate having a plurality of wells, each well comprising a precipitating solution reservoir and a drop chamber having a crystallization surface, said precipitating solution reservoir containing a volume of precipitating solution, sitting a droplet of solution containing a macromolecule to be crystallized on said crystallization surface, sealing the droplet of solution in the well with the droplet of solution separated from the precipitating solution contained in the well, and inverting the plate upside-down so that the droplet of solution be suspended from said crystallization surface with said precipitating solution being retained in said precipitating solution reservoir.

In accordance with a still further general aspect of the present invention, there is provided a hanging-drop crystallization support adapted to be inverted over a well containing a crystallization solution, the hanging drop crystallization support comprising an undersurface defining at least one cavity for receiving a droplet of solution containing a precipitating solution and a macromolecule to be crystallized, the cavity having a bottom surface and being sized to receive a predetermined volume of macromolecule solution so that when vapor equilibrium is reached between the crystallization solution and the droplet of solution, the bottom surface of the cavity is still completely covered by the solution.

BRIEF DESCRIPTION OF THE DRAWINGS

Having thus generally described the nature of the invention, reference will now be made to the accompanying drawings, showing by way of illustration a preferred embodiment thereof, and in which:

FIGS. 7a to 7d illustrate the various steps involved in the manufacturing of a crystallization solution capsule in accordance with a preferred embodiment of the present invention;

FIGS. 8a to 8c are schematic side elevation views of wells provided with drop support and crystallization retention means for allowing crystallization plates to be prepared as standard sitting-drop plates and then inverted for carrying hanging-drop crystallization experiments.

FIGS. 9a to 9c are schematic side elevation views of the wells shown in FIGS. 8a to 8c illustrating the loading operation of the crystallization plates;

FIGS. 10a to 10c are schematic side views of the wells shown in FIGS. 8a to 8c when the crystallization plate have been loaded and inverted to a crystal growth/monitoring position for allowing hanging-drop crystallization experiments to be conducted;

FIG. 11 is a plan view of the undersurface of a multi-cavity hanging-drop support in accordance with a further aspect of the present invention; and FIG. 12 is a schematic elevation view of one of the cavities of the multi-cavity hanging-drop support shown in FIG. 11.

DESCRIPTION OF THE PREFERRED EMBODIMENTS

The present invention provides for the pre-filling of the a multi-well crystallization plate, such as a hanging-drop microplate or a sitting-drop microplate, with a desired number of crystallization or precipitating solutions for transport and handling prior to utilization in labs. In this way, the technician receives a "ready-to-use" plate, thus eliminating the time-consuming operation of filling each well with the appropriate precipitating solution.

Figure 1:
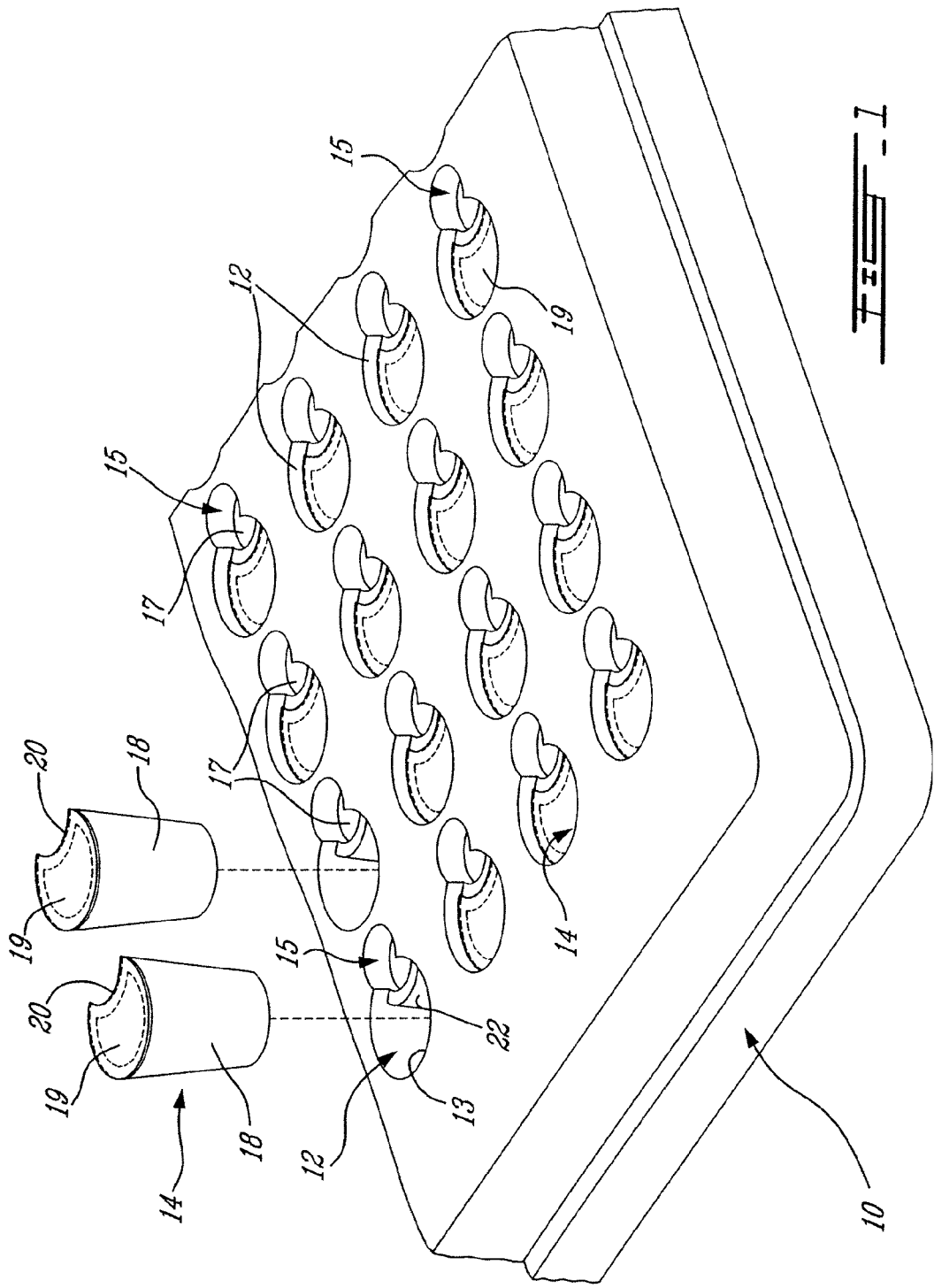
FIG. 1 is a perspective view of a crystallization plate pre-filled with encapsulated crystallization solution in accordance with a preferred embodiment of the present invention.
Figure 2:
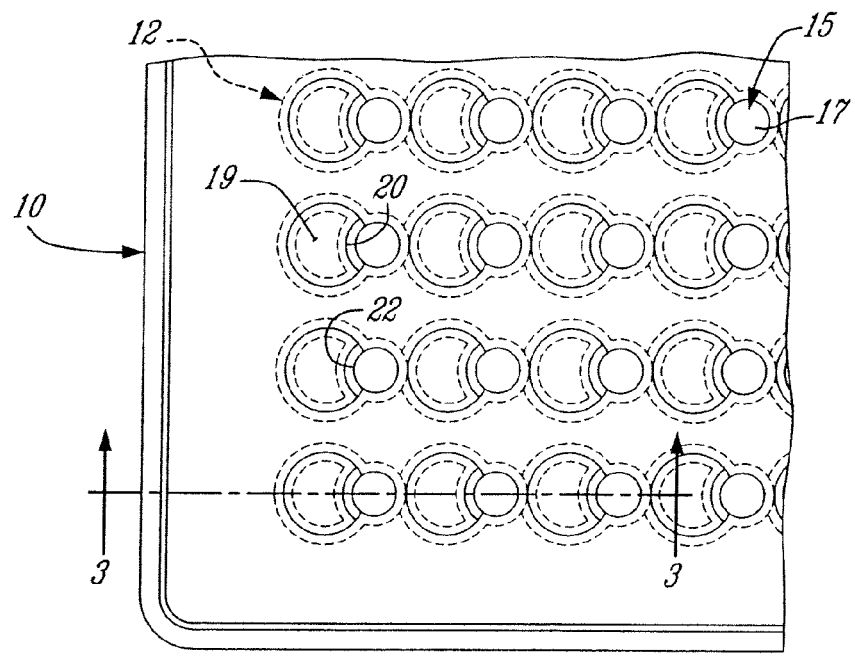
FIG. 2 is a top plan view of the pre-filled crystallization plate shown in FIG. 1.

FIG. 1 exemplifies one possible application of the present invention. More specifically, FIG. 1 shows a sitting-drop crystallization plate 10 comprising a plurality of wells 12. Each well 12 includes a central reservoir 13 in communication with a drop chamber 15 having a crystallization surface or drop support 17 on which a solution containing the macromolecule to be crystallized rests during the crystallization experiment (see FIG. 4). The plate 10 itself is of conventional construction and can adopt various configurations without departing from the scope of the present invention.

Figure 3:
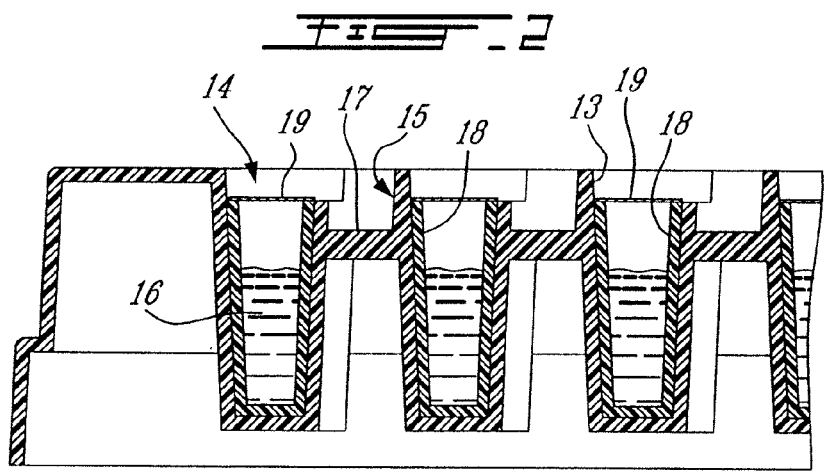
FIG. 3 is a cross-sectional view taken along line 3-3 in FIG. 2.

A capsule 14 containing a crystallization solution 16 (FIGS. 3 and 4) is received in a tight fit manner into the central reservoir 13 of each well 12. Alternatively, the capsule 14 could be loosely received in the well 12, and adhesively retained therein. It is also understood that more than one capsule 14 could be placed per well 12. As shown in FIGS. 1 and 3, each capsule 14 comprises a reservoir in the form of a portion cup 18 having an open top end closed by a seal 19 preferably heat sealed to the cup 18. The portion cup 18 is preferably molded by injecting a molten thermoplastic material, such as polypropylene, into a capsule formed cavity mold (not shown) of an injection molding machine. It is understood that the material forming the cup 18 must be chemically inert relative to the crystallization solution contained therein. Also, in the case of hanging-drop applications where the drop containing the macromolecule to be crystallized is suspended directly above the crystallization solution, the cup 18 must be sufficiently clear or transparent to allow light to pass therethrough so that crystal growth on the drop support can be observed and monitored under a microscope. In the illustrated example, the cup 18 has a generally frusto-conical shape but it is understood that it might be of any form complementing that of the wells of the plate in which it is to be placed. In the illustrated embodiment, each cup 18 has an axially extending semi-circular recess 20 adapted to receive a corresponding axially extending protrusion 22 formed in each central reservoir 13. The engagement of the protrusion 22 in the recess 20 locks the cup 18 against rotation in the well 12.

The seal 19 is preferably provided in the form of a pierceable sheet material or membrane, such as a polypropylene coated aluminum foil, that can be easily punctured as by pricking with the tip of the pipette used to pipet the crystallization solution in order to mix it with the solution containing the macromolecule to be crystallized. Other piercing tool can be used as well to punctured the seal 19. The material used to form the pierceable seal 19 must be such as not to recover its form after the piercing instrument is withdrawn from the well 12. The instrument must leave a permanent hole 24 (FIG. 4) of a desired size in the seal 19 to allow subsequent vapor diffusion between the droplet 26 (FIG. 4) and the crystallization solution 16. By varying the size of the hole 24, the rate of the vapor diffusion between the droplet 26 and the crystallization solution 16 can be advantageously controlled. The use of a pierceable seal is also advantageous in that the seal does not have to be removed which would necessitate an extra step. Furthermore as discussed hereinbefore, removal of the seal is undesirable in that it could introduce unwanted experimental variations due to the change in the volume or the concentration of the solution in the reservoir when some liquid is taken away with the seal. This thus eliminates the need for centrifuging the plate prior to unsealing the wells to make sure that no liquid remains underneath the seal of each well. The use of pierceable seals also render possible the highly desirable individual sealing of the wells which has been heretofore limited by the extra work that would be required for separately removing each individual seal. With the use of pierceable seal there is no need to physically remove the seal and the seal can even be broken during the pipetting operation of the crystallization solution 16, thereby allowing combining two steps in one.

As shown in FIG. 3, the encapsulation of the crystallization solution advantageously allows isolating the crystallization surface 17 from the crystallization solution 16, thereby avoiding contamination of the crystallization surface 17 during shipping and handling of the pre-filled plate 10 prior utilization thereof. From FIG. 3, it can be readily appreciated that the top surface of the reservoirs 18 and, thus, the seals 19 are recessed into the wells 12 at a distance from the top surface of the plate 10. In this way, the top surface of the plate remain available for sealing engagement with a cover, such as the tape 30 illustrated in FIG. 4, to provide a second level of seal independent from the first level of seal formed by the seals 19. The second level of seal is used to hermetically seal the crystallization solution 16 and the droplet 26 from the atmosphere so that vapor diffusion can occur between them after the first level of seal has been broken. As will be seen hereinafter with reference to FIG. 6, the spacing between the seals 19 and the top surface of the plate provides the room required for suspending a droplet of solution above the crystallization solution in a hanging-drop crystallization set-up. This is necessary where the punctured hole is not sized to receive the droplet. In certain instances, however, it might by advantageous to apply the seal at the top of the well and to define a hole of sufficient size for allowing a hanging droplet to extend through the punctured hole defined in the seal. This would ensure that the observation of the droplet is not compromised by the presence of the seal.

Figure 4:
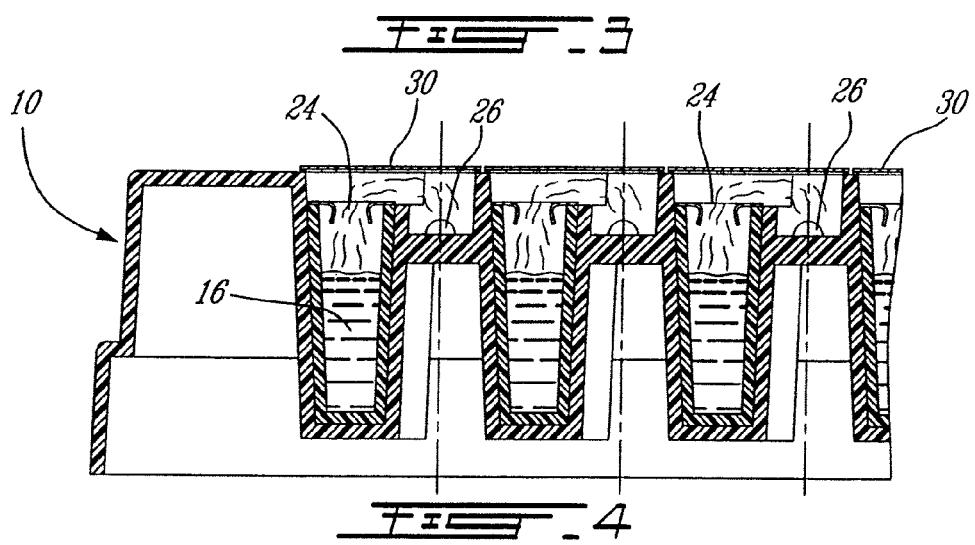
FIG. 4 is a cross-sectional view of the pre-filled crystallization plate with the macromolecular drops dispensed on the drop supports integrated to the wells of the plate, the wells being sealed with tape to permit vapor diffusion to occur between the crystallization solution and the drops once the pre-filling seals have been broken.

In use, the technician receives the crystallization plate 10 pre-filled with the crystallization solution 16, as shown in FIG. 3. Subsequently, a selected biological macromolecule drop 26 (FIG. 4) is dispensed on the crystallization surface 17 of a desired number of wells 12. Then, the crystallization solution 16 contained in these wells 12 is pipetted by puncturing a hole 24 in the seals 19 of the wells 12, preferably with the aid of the tip of the pipette, and the pipette is lowered into the wells 12 to suction a desired amount of crystallization solution from each well 12. At this time, the pipette can also be used to add a given substance into the crystallization solution, thereby allowing conducting various experiments with different crystallization solutions on a same plate 10 pre-filled with a single crystallization solution. Different additives could be introduced in each well. Thereafter, the pipetted solution is mixed with the macromolecule drop 26 on each crystallization surface 17. Finally, the set-up is completed by lowering individual tapes 30 over the so prepared wells 12 so as to close the same, as shown in FIG. 4. It is noted that a single length of tape could cover more than one well at a time. It is also understood that the type of cover used is not material to the present invention and that various types of covers could be used to hermetically seal the wells 12 after the macromolecule drops have been poured therein. For instance, individual caps, such as those described in PCT application No. PCT/CA00/00119 the content of which is herein incorporated by reference could be used as well.

The dispensing of the macromolecule drops and the pipetting of the crystallization solution in the wells may be carried out either manually or through commercial automated pipetting apparatus. The second level of sealing of the wells may also be carried out manually or in an automated fashion manner.

The encapsulation of the crystallization solution is illustrated in FIGS. 7a to 7d. The portion cups 18 are preferably obtained by injecting a thermo-plastic material into a capsule formed cavity mould (not shown). After having been injected into the mould, the thermo-plastic material is allowed to cool down to create the cups 18. Then, the cups 18 are filled with the crystallization solution 16, as shown in FIG. 7b. Thereafter, a foil 19 of pierceable material is preferably heat sealed on top of each cup 18, as shown in FIGS. 7c and 7d. As shown in FIG. 7a, the top end of each cup 18 is bevelled to increase the resulting bonding surface between the foil 19 and the upper rim of the cup 18, as illustrated in FIG. 7d. During the heat sealing operation, the upper bevelled end of the cups will melt to form the flat rim shown in FIG. 7d. Finally, the cups 18 are inserted into the wells 12.

It is noted that the cups 18 could also be integrally formed with the wells 12 by moulding them directly into the wells 12 of the plate 10, thereby eliminating the additional step of inserting the cups 18 into the wells 12 to pre-fill the plate. However, this has the disadvantage that when the seal 19 is heat sealed, the plate 10 must be made from a heat seal compatible material which does not necessary has the best optical properties.

Figure 5:
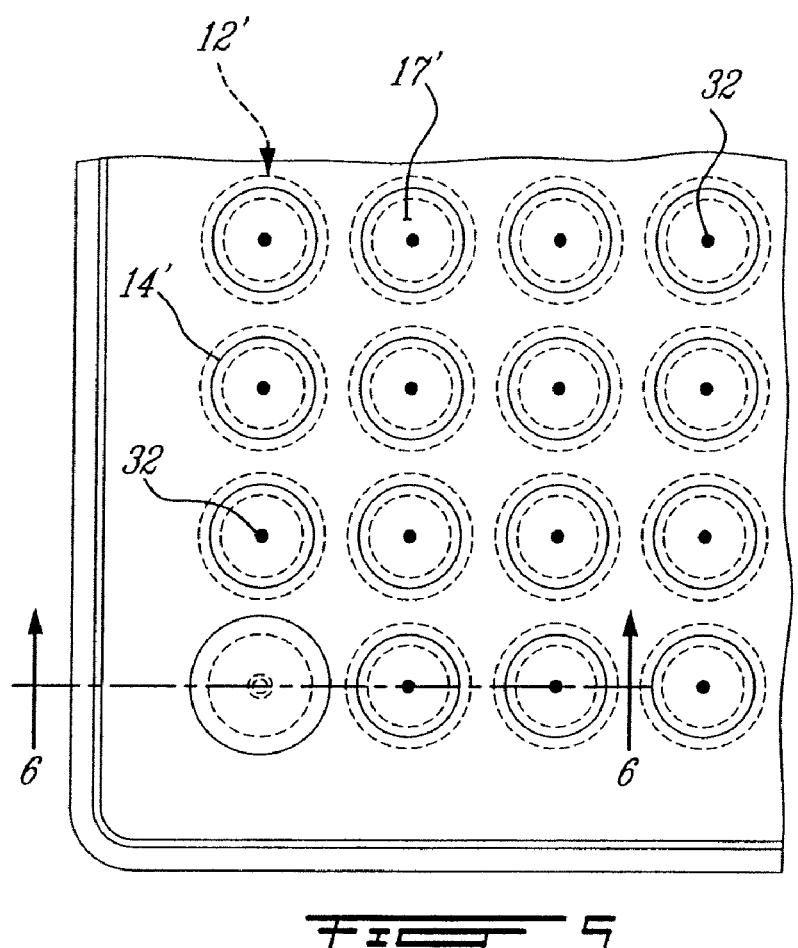
FIG. 5 is a top plan view of a hanging-drop set-up in accordance with a second embodiment of the present invention.
Figure 6:
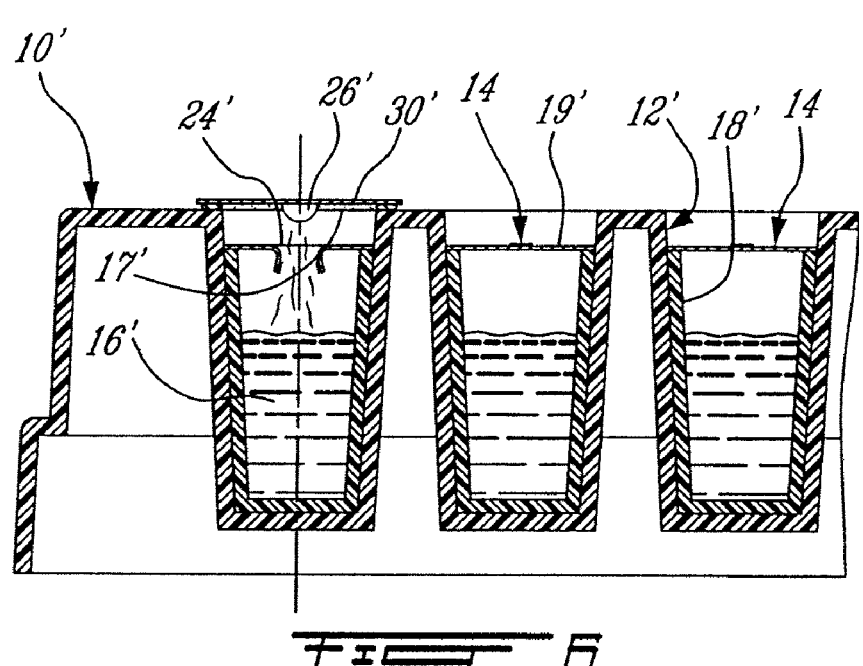
FIG. 6 is a cross-sectional view taken along line 6-6 in FIG. 5.

FIGS. 5 and 6 illustrate another possible application of the present invention wherein the encapsulated crystallization solutions are used in a hanging-drop experimental set-up. Like reference numerals are used for referring to like parts.

In the case of an hanging drop experiment, it is important that the hole 24' defined in the pierceable seal 19' be in vertical alignment with the suspended macromolecule drop 26' in order to permit the passage of light therethrough and, thus, observation of crystal growth through the drop support 17'. To this end, a reference 32 could be provided, for instance, on the top surface of the seals 19' to provide a visual indication of where the hole 24 is to be pierced. Also the tape is replaced by glass plates 30' and grease is provided about the rim of each well to provide a seal between the glass plates 30' and the wells.

It is noted that the capsules 14 could also take the form of a little pouch or any other pierceable sealed vessel adapted to contain a crystallization solution. Furthermore, according to a further embodiment of the present invention which is not illustrated, the crystallization solution could be directly dispensed into the wells and a pierceable seal could be applied on or in the well to seal the crystallization solution therein. An inner shoulder would have to be defined in each well for allowing heat sealing of a foil in the wells. In the event that the pierceable seal is heat sealed to the top surface of the crystallization plate, the wells could still be unsealed separately from one another by puncturing individual holes in the seal over selected wells. Then, a grease or the like could be applied directly on the pierceable seal about each individual hole defined therein to provide a proper seal between the unsealed wells and the coverglass (the hanging-drop support) inverted thereover. Alternatively, the grease could be replaced by an adhesive on the coverglass. In this case, the coverglass would simply be placed on top of the crystallization plate in direct contact with the pierceable seal.

The encapsulation of the crystallization solution 16 or the provision of a pierceable seal between the drop support 17 and the volume of crystallization solution 16 contained in the main reservoir 13 of a well 12 of a sitting-drop plate 10, as disclosed hereinbefore, also has the benefit of allowing the sitting-drop plate to be turned upside-down to carry on hanging-drop crystallisation experiments. In this way, it becomes possible to perform hanging drop crystallization experiments with sitting-drop plates. This is advantageous in that it is no longer necessary to dispense a droplet of solution containing the macromolecule to be crystallized on a separate support, such as a coverglass, which subsequently has to be inverted over a corresponding well of the microplate and then sealed thereto. Such a separate support for hanging drop experiments has been heretofore needed because known tools do not allow setting a droplet of solution 26 on the crystallization plate and inverting the whole plate. Precipitating solution would drop from the reservoirs 13, thereby providing for the contamination of the crystallization surfaces or drop supports 17 when the plate is manipulated.

According to a characteristic of the present invention, the experimental set-up can be prepared as if a sitting-drop crystallization experiment was to be conducted and then the whole sitting-drop crystallization plate can be inverted (i.e. turned over completely) such that the droplets 26 of solution containing the macromolecules to be crystallized hang from their respective drop supports 17 (FIGS. 10a to 10c). Once the plate has been inverted, the crystallization solution 16 is prevented from flowing out of the main reservoir 13 due to the presence of the seal 19 in the reservoir 13. The hole 24 pierced in the seal 19 must be sufficiently large to permit vapour diffusion to occur between the droplet 26 and the crystallization solution 16 but must however be small enough to ensure that the crystallization solution 16 will remain in the reservoir 13 by virtue of the surface tension of the solution 16.

As shown in FIGS. 8a to 8c, this can also be done by providing various other types of flow restrictors in each main reservoir 13 of the crystallization plate. For instance, each well 13 could be integrally manufactured with an inner annular lip 34 projecting inwardly from the mouth of the reservoir 13 to partially close the same, as shown in FIG. 8a. The small opening 36 defined by the annular lip 34 ensures that the surface tensions of the solution 16 will prevent the solution from falling out of the reservoir when the plate is inverted, while allowing vapour diffusion to occur between the solution 16 and the droplet 26, as shown in FIG. 10a. The opening 36 is preferably sized to receive regular micropipette tips and liquid handling robot dispensing heads. Configuration of the opening must allow deposit of the crystallization solution and retain solution when upside down. Extra-closing means can be added to the solution reservoir after filing to retain liquid in the reservoir when turn upside-down.

Alternatively, the flow restrictor could take the form of a fine porous filtration membrane provided at the open end of the reservoir 16. The membrane would be impermeable to liquid but permeable to vapours.

According to the embodiments shown in FIGS. 8b and 8c, the reservoirs 13' and 13" could have an inside diameter small enough so that the solution 16 is retained inside the reservoir 13' and 13" by capillary effect when the crystallization plate is inverted, as shown in FIGS. 10b and 10c. Typically, the inside diameter of such capillary reservoirs would be less than 3.5 mm.

The capillary reservoir 13" differs from the capillary reservoir 13' in that the inside diameter thereof gradually degreases towards the open end thereof. The capillary reservoir 13" has a generally frusto-conical configuration.

In use as shown in FIGS. 9a, 9b and 9c, each crystallization plate is filled just has a regular sitting-drop plate by dispensing a crystallization solution in the reservoirs 13, 13' and 13", pipetting a portion of the crystallization solution in the reservoirs 13, 13' and 13", and mixing the crystallization solution that has been pipetted with a macromolecule solution on the crystallization surface 17, 17' and 17" to obtain a droplet of solution 26. A seal 38 is then applied on the top surface of each plate to seal the wells 12, 12' and 12". Then, the so prepared crystallization plates are inverted to a crystal growth/monitoring position as shown in FIGS. 10a, 10b and 10c in order to conduct hanging-drop crystallization experiments.

The addition of flow restrictor to the crystallization reservoir of a crystallization plate having integral drop support, such as the ones found on standard sitting-drop plates, provides for the formation of universal crystallization plates that can be selectively used for performing sitting or hanging drop crystallization experiments.

The present invention advantageously allows setup of multiple hanging-drop experiments without having to manually/automatically invert and index the crystallization supports over the wells/reservoirs during experimental setup. With the present invention, the user simply turns the whole crystallization plate upside-down to pass from a loading/unloading position, shown in FIGS. 9a, 9b, 9c, to the crystal growth/monitoring position.

The present invention provides for hanging-drop plates having integral crystallization surface, thereby obviating the need for inverting separate crystallization supports over the wells of the plate. According to conventional hanging drop setups, the rows of wells of the microplates cannot be covered with the corresponding hanging drop supports in a single operation in that the hanging drop support must be inverted one row at a time because of the mirror effect when inverting one product over another product. With the present invention, the precipitating solution reservoir and the drop support of each well are side by side and thus, the macromolecule drops of a plate can be placed in a hanging state in a single operation by simply inverting the plate. This thus greatly simplifies the manipulations.

It is noted that the drop supports 17 do not necessarily have to be planar. They could be of a different configuration in order to facilitate the positioning of the macromolecule drops and also prevent subsequent spreading of the drops. This could be done by providing a recess in the drop support or other types of barrier or drop retainer.

FIG. 11 shows a multi-cavity hanging-drop support 40 adapted to be inverted over a well of a crystallization plate and sealed thereto for allowing a plurality of crystallization experiments to be carried on in a same well.

The hanging drop support 40 can be provided in the form of a cap having well engaging means (not shown) adapted to cooperate with corresponding cap engaging means (not shown) in the well or on the plate adjacent to the open end of the well. As shown in FIG. 9, the hanging-drop support 40 is characterized by a plurality of circular cavities 42a, 42b . . . 42f or recesses defined in the undersurface 44 thereof for receiving respective droplets of solution containing macromolecules to be crystallized. The cavities 42a, 42b . . . 42f prevent spreading of the droplets, thereby preventing the droplets from becoming in contact with each other. The cavities 42a, 42b . . . 42f are also useful to localise the droplets on the hanging drop support and contribute to facilitate the observation of the crystal growth.

The dimensions of each cavity are determined to receive a predetermined volume of macromolecule solution. More particularly, the relation between the dimensions of a given cavity and the volume of solution must be such that the initial volume of solution dispensed in the cavity does not exceed the solution volume holding capacity of the cavity and that once the vapour equilibrium has been reached between the crystallization solution contained in the well and the macromolecule solution hanging from the drop support 40, the bottom surface of the cavity be still completely covered by the remaining volume of macromolecule solution. This will advantageously provides for a better visualization of the formed crystals while at the same times improving the reproducibility of the experience. In general the volume of the cavity generally corresponds to that of the drop it is intended to contain. The droplet of solution once poured into the cavity will be in contact with the sidewalls bounding the cavity in order to avoid spreading of the droplet.

The cavities 42a, 42b . . . 42f are preferably of various dimensions for receiving different volumes of macromolecule solutions.

The multi-cavity hanging drop support 40 is preferably made from plastic material having good optical properties and is preferably obtained by injection moulding. The drop support 40 must be at least transparent at the cavity locations to permit observation of the crystal growth. The bottom surface 41 of each cavity 42a, 42b . . . 42f is preferably planar. Also, as shown in FIG. 12, the bottom surface 41 merges with the sidewall through an inclined wall segment 43 defining an angle ⊕ of about 45 degrees in order to facilitate the recuperation of the crystals.

The walls of the cavities 42a, 42b . . . and 42f can also be submitted to waterproof, hydrophobicity and like treatments.

The cavities provides for a better visualization of the crystal formed on the hanging drop support. The cavities enable to equalize the liquid level for a better visualization.

It is understood that the hanging-drop support 40 could be provided with a single recess or cavity in the undersurface thereof. This will still be advantageous over prior art hanging-drop supports which generally lack any means for improving the visualization of the crystals formed thereon.

The invention claimed is:

1. A hanging-drop crystallization support adapted to be inverted over a well containing a crystallization solution, the hanging drop crystallization support comprising an undersurface defining at least one cavity for confining a droplet of solution containing a precipitating solution and a macromolecule to be crystallized, the cavity having a bottom surface and being sized to receive a predetermined volume of macromolecule solution so that when vapor equilibrium is reached between the crystallization solution and the droplet of solution, the bottom surface of the cavity is still completely covered by the solution.

2. A hanging-drop crystallization support as defined in claim 1, wherein a plurality of cavities are provided in said undersurface for receiving respective droplets of macromolecule solution, thereby allowing to conduct several crystallization experiment in a same well.

3. A hanging-drop crystallization support as defined in claim 2, wherein said cavities are of at least two different sizes to respectively contain at least two different volumes of macromolecule solution.

4. A hanging-drop crystallization support as defined in claim 1, wherein said bottom surface is made of a transparent material.

5. A hanging-drop crystallization support as defined in claim 1 wherein the support is made of a plastic material.

6. A hanging-drop crystallization support as defined in claim 5, wherein the support is made from injected molded plastic material.

7. A hanging-drop crystallization support as defined in claim 1, wherein said bottom surface is planar.

8. A hanging-drop crystallization support as defined in claim 7, wherein each said cavity is bounded by walls, and wherein said bottom surface merges with said walls through an inclined wall segment defining an angle $\ominus$ of about 45 degrees.

* * * * *